(12) United States Patent
An (10) Patent No.: US 8,542,548 B2
(45) Date of Patent: Sep. 24, 2013

(54) SEMICONDUCTOR MEMORY DEVICE AND THERMAL CODE OUTPUT CIRCUIT CAPABLE OF CORRECTLY MEASURING THERMAL CODES

(75) Inventor: Sun Mo An, Seongnam-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 1193 days.

(21) Appl. No.: 12/228,819

(22) Filed: Aug. 15, 2008

(65) Prior Publication Data

US 2009/0268777 A1 Oct. 29, 2009

(30) Foreign Application Priority Data

Apr. 28, 2008 (KR) .................. 10-2008-0039585

(51) Int. Cl.
*G11C 7/04* (2006.01)
(52) U.S. Cl.
USPC ........................................ 365/211; 365/222
(58) Field of Classification Search
USPC ................. 365/211, 244, 222, 212
See application file for complete search history.

(56) References Cited

U.S. PATENT DOCUMENTS 6,873,509 B2 3/2005 Parisch et al.
2008/0106451 A1* 5/2008 Jeong et al. .................... 341/155

FOREIGN PATENT DOCUMENTS

| KR | 10-2005-0033123 A | 4/2005 |
| KR | 10-2006-0084572 A | 7/2006 |
| KR | 10-2007-0109107 A | 11/2007 |
| KR | 10-2008-0029299 A | 4/2008 |

\* cited by examiner

*Primary Examiner* — Alexander Sofocleous
*Assistant Examiner* — Khamdan Alrobaie
(74) *Attorney, Agent, or Firm* — John P. White; Cooper & Dunham LLP (57) ABSTRACT

A thermal code output circuit is provided, comprising a pulse signal generator configured to receive multiple period signals and generate a pulse signal in response to a test mode signal, a thermal code output unit configured to output multiple thermal codes in response to the pulse signal, and a strobing signal output unit configured to output the pulse signal or a reference voltage selectively as a strobing signal in response to the test mode signal.

23 Claims, 7 Drawing Sheets

SEMICONDUCTOR MEMORY DEVICE AND THERMAL CODE OUTPUT CIRCUIT CAPABLE OF CORRECTLY MEASURING THERMAL CODES

TECHNICAL FIELD

The present disclosure relates to a semiconductor memory device, and more particularly to a thermal code output circuit capable of correctly measuring a thermal code being outputted.

BACKGROUND

In case of a semiconductor memory device, particularly a mobile DRAM, a temperature compensated self refresh (TCSR) circuit is used to reduce a current consumption amount. The TCSR circuit is a circuit to change a self refresh period according to temperature, thereby reducing consumption current. In other words, by using the data retention time of a DRAM, the TCSR circuit shortens the self refresh period to increase a current consumption amount when the temperature is high, and lengthens the self refresh period to reduce a current consumption amount when the temperature is low.

In a digital TCSR circuit among the TCSR circuits, a digital thermometer is mounted within a semiconductor memory device, and a thermal code generated from the digital thermometer is coded to determine a self refresh period. The performance of a digital thermometer depends on how much corresponding thermal codes to the internal temperature of a DRAM are generated.

In case of a mobile DRAM, an input pad and a TQ pad are located on a side, and a DQ pad is located on the other side. Accordingly, a method of outputting a thermal code using a DQ pad in a semiconductor memory device has a problem that loading becomes large since the thermal code should be transmitted from an input pad to a DQ pad.

In order to improve this, there is used a method of outputting a thermal code using a TQ pad which is located on the same side with an input pad. In case of outputting a thermal code in this manner, there is an advantage that the number of transmission lines required for a thermal code transmission can be decreased, thereby reducing an area.

On the other hand, there is a test mode for measuring a thermal code being outputted through a TQ pad. This test mode is progressed in such a manner that three test mode signals are applied to output one thermal code, and therefore 18 test mode signals should be inputted to output a 6-bit thermal code generally being used.

Since test mode signals should be manually inputted by a tester, there occurs, at most, a several seconds of delay when outputting a thermal code. Accordingly, it is difficult to confirm the outputted thermal code at once using an oscilloscope.

In addition, it is difficult to judge whether or not the outputted thermal code is an accurate code unless test mode signals corresponding to a thermal code is correctly strobed. In particular, it becomes more difficult to judge whether or not the outputted thermal code is correct when a phase between thermal codes being sequentially outputted is identical.

SUMMARY

In an aspect of this disclosure, a thermal code output circuit is provided in which test mode signals are inputted at once to output a thermal code comprised of multiple bits, and a strobing signal for strobing the thermal code is outputted to correctly measure the outputted thermal code.

In another aspect of this disclosure, a thermal code output circuit comprises a pulse signal generator which receives multiple period signals and generates a pulse signal in response to a test mode signal, a thermal code output unit which outputs multiple thermal codes in response to the pulse signal, and a strobing signal output unit which outputs the pulse signal or a reference voltage selectively as a strobing signal in response to the test mode signal.

A thermal code output circuit can further comprise a period signal generator which increases a period of a period signal inputted through a counting operation and generates the multiple period signals.

The pulse signal generator can include an enable generator which receives a first period signal and the test mode signal and generates an enable signal, an end signal generator which receives the first period signal and second through fourth period signal and generates an end signal, and a signal generator which receives the enable signal and the end signal and generates the pulse signal.

The enable signal is preferably generated as a period signal having a same period as the first period signal during the test mode signal is enabled.

The end signal generator preferably generates the end signal in which an enable interval is adjusted according to a combination of the first through fourth period signals.

The signal generator preferably generates the pulse signal having a predetermined pulse width from an interval that the enable signal is enabled to an interval that the end signal is enabled, and the pulse signal is generated with a same period as the first period signal.

The signal generator can include a delay unit which delays the enable signal for a predetermined interval, an inverter which inverts the enable signal, a first logic element which receives an output signal of the delay unit and an output signal of the inverter and performs a logic operation, and a second logic element which receives an inverting signal of the end signal and an output signal of the first logic element and performs a logic operation.

The thermal code output unit preferably sequentially outputs multiple thermal codes through a pad in response to the pulse signal.

The strobing signal output unit can include a first transmission element which transmits the reference voltage to a pad in response to the test mode signal, and a second transmission element which transmits the pulse signal to the pad in response to the test mode signal.

The reference voltage preferably has a level corresponding to the internal temperature of a semiconductor memory device.

The multiple thermal codes are preferably outputted in synchronization with the strobing signal.

In another aspect, a semiconductor memory device is provided which comprises a thermal sensor which generates a thermal code, a thermal code output unit which receives a test mode signal, generates and outputs a pulse signal and outputs the thermal code in response to the pulse signal, a first pad which outputs the thermal code, and a second pad which outputs the pulse signal as a strobing signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, the present invention will be described in more detail through examples and exemplary embodiments. However, the examples and embodiments are for illustrative purposes only and are not intended to limit the scope of the disclosure.

Figure 1:
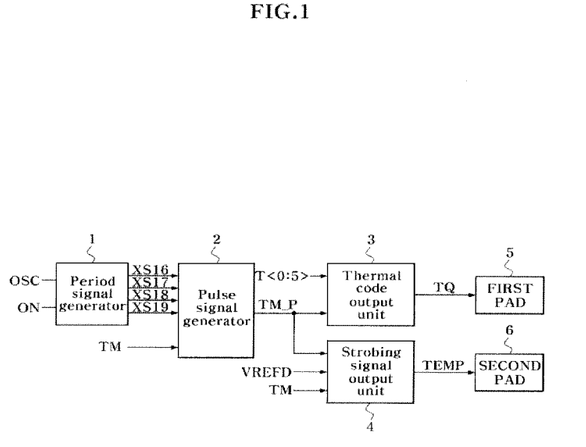
FIG. 1 is a block diagram illustrating a structure of a thermal code output circuit according to an embodiment of the present disclosure.

FIG. 1 is a block diagram illustrating a structure of a thermal code output circuit according to an embodiment of the present disclosure.

As illustrated, a thermal code output circuit according to this embodiment includes a period signal generator 1, a pulse signal generator 2, a thermal code output unit 3, and a strobing signal output unit 4.

Figure 2:
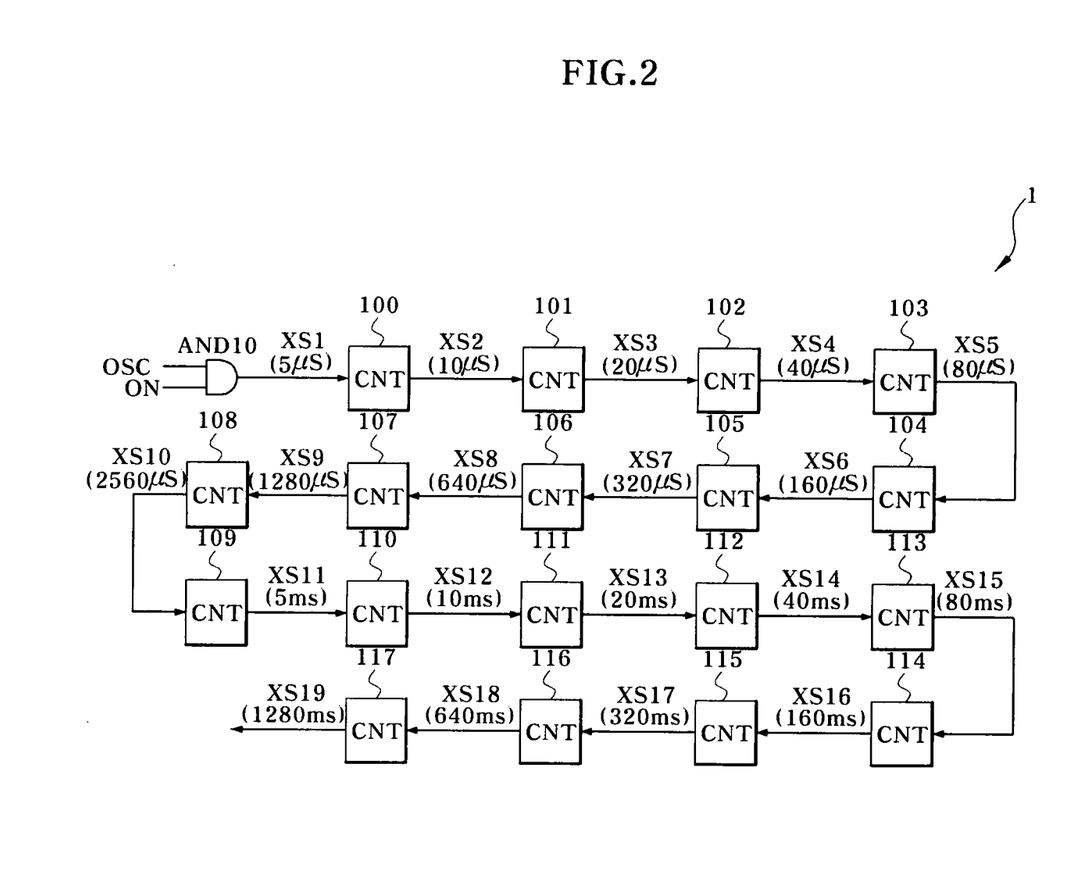
FIG. 2 is a block diagram illustrating a structure of a period signal generator included in the thermal code output circuit of FIG. 1.

The period signal generator 1, as illustrated in FIG. 2, includes an AND gate AND10 which receives a basic period signal OSC having a period of 5 μs and a start signal ON and generates a first period signal XS1, and multiple counters 100-117 which perform a counting operation and sequentially generate multiplied signals of the first period signal XS1. The counter 100 receives the first period signal XS1 to generate a second period signal XS2, which is a multiplied signal having a period that is two times the period of the first period signal XS1, and the counter 101 receives the second period signal XS2 to generate a third period signal XS3, which is a multiplied signal having a period that is four times the period of the first period signal XS1, and the counter 117 receives a eighteenth period signal XS18 to generate a nineteenth period signal XS19, which is a multiplied signal having a period that is $2^{18}$ times the period of the first period signal XS1. Here, the first period signal XS1 has a 5 μs period, and the second period signal XS2 has a 10 μs period, and the nineteenth period signal XS19 has a 1280 ms period. However, in case of an eleventh period signal XS11, it is assumed that it has a 5,000 μs (i.e., 5 ms) period to simply show a period of subsequent period signals, although more precisely it has a period of 5120 μs.

Figure 3:
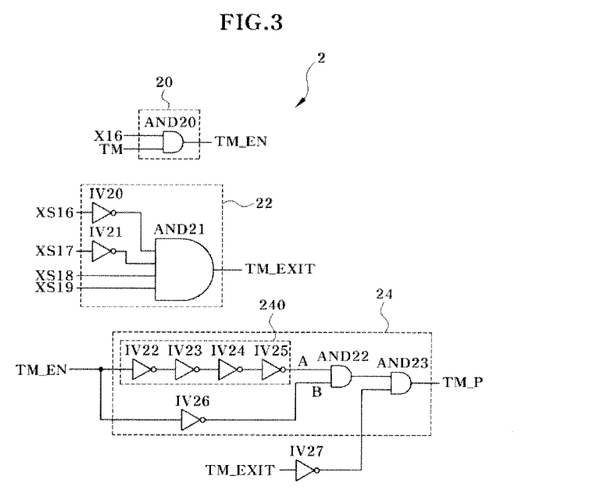
FIG. 3 is a circuit diagram illustrating a pulse signal generator included in the thermal code output circuit of FIG. 1.

The pulse signal generator 2, as illustrated in FIG. 3, includes an enable signal generator 20 having an AND gate AND20 which receives a sixteenth period signal X516 and a test mode signal TM and performs a logical multiplication operation to generate an enable signal TM_EN, an end signal generator 22 which receives inverted signals of a sixteenth and a seventeenth period signals XS16 and XS17 and performs a logical multiplication operation to generate an end signal TM_EXIT, and a signal generator 24 which receives an enable signal TM_EN and an end signal TM_EXIT and generates a pulse signal TM_P.

The signal generator 24 includes a delay unit 240 which delays the enable signal TM_EN for a predetermined interval, and an inverter IV26 which inverts the enable signal TM_EN, and an AND gate AND22 which receives an output signal of the delay unit 240 and an output signal of the inverter IV26 and performs a logical multiplication operation, and an AND gate AND23 which receives an inverted signal of the end signal TM_EXIT and an output signal of the AND gate AND22 and performs a logical multiplication operation.

The thermal code output unit 3 receives first through sixth thermal codes T<0:5> and a pulse signal TM_P, and sequentially outputs the first through sixth thermal codes T<0:5> via an output signal TQ through a first pad 5 in response to the pulse signal TM_P.

Figure 4:
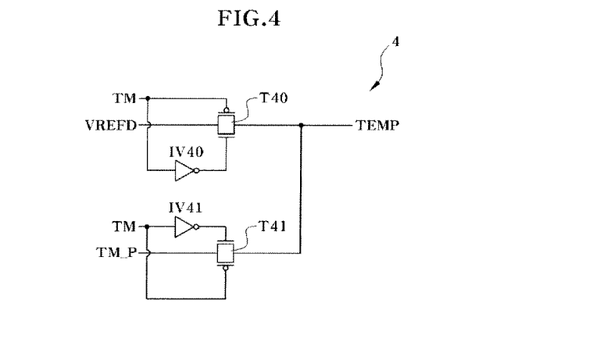
FIG. 4 is a circuit diagram illustrating a strobing signal output unit included in the thermal code output circuit of FIG. 1.

The strobing signal output unit 4, as illustrated in FIG. 4, includes a transmission gate T40 which transmits a reference voltage VREFD via an output signal TEMP in response to a test mode signal TM, and a transmission gate T41 which transmits a pulse signal TM_P via the output signal TEMP in response to a test mode signal TM. The output signal TEMP is outputted through a second pad. Here, the reference voltage VREFD is a signal having a level corresponding to the internal temperature of a semiconductor memory device.

An operation of a thermal code output circuit configured as described above will be described as follows, with reference to FIG. 5.

First, the period signal generator 1 receives a start signal ON which is enabled to high level and generates a first period signal XS1 having a same period (5 μs) as a basic period signal OSC, and multiplies the first period signal XS1 through counters 100-117 and generates second through nineteenth period signals XS2-XS19. Here, the sixteenth period signal XS16 is generated to have a period of $2^{15}$ times that of the first period signal XS1, i.e., about a 160 ms period, and the seventeenth period signal XS17 is generated to have a 320 ms period, and the eighteenth period signal XS18 to have a 640 ms period, and the nineteenth period signal XS19 to have a 1280 ms period.

Then, the pulse signal generator 2 receives the test mode signal TM and the sixteenth through nineteenth period signals XS16-XS19 and generates an end signal TM EXIT and a pulse signal TM_P. The operation of generating the end signal TM EXIT and the pulse signal TM_P will be described in more detail as follows.

The enable signal generator 20 transmits the sixteenth period signal XS16 as an enable signal TM_EN when the test mode signal TM is enabled to high level. Thus, as illustrated in FIG. 5, the enable signal TM_EN is generated to have a same period as the sixteenth period signal XS16 during an interval where the test mode signal TM is high level. Generally, tester can set up an interval of the test mode signal TM.

Figure 5:
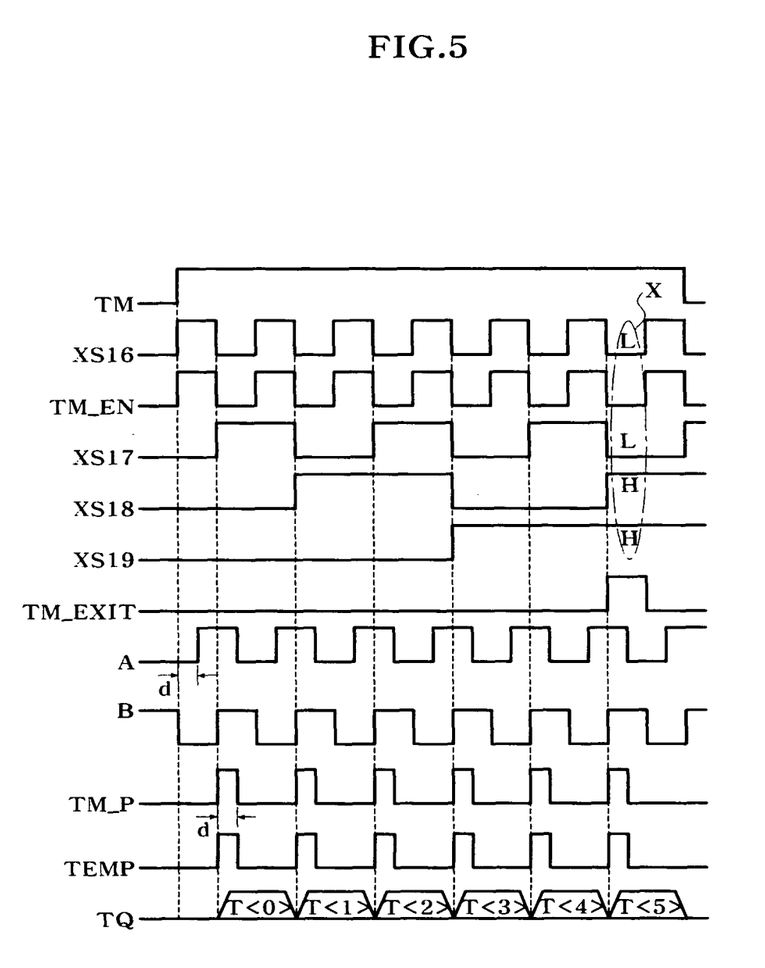
FIG. 5 is a timing diagram explaining an operation of the thermal code output circuit of FIG. 1.

The end signal generator 22 receives the sixteenth through nineteenth period signals XS16-XS19 and generates an end signal TM EXIT, which is enabled to a high level, when a combination of the sixteenth through nineteenth period signals XS16-X519 is 'low level, low level, high level, and high level' as shown in in a portion "X" of FIG. 5. The enabled interval of the end signal TM EXIT corresponds to a sixth period interval of the enable signal TM_EN after the test mode signal TM is enabled. In other words, the end signal TM EXIT is enabled to a high level for a predetermined interval after six pulses of the enable signal TM_EN have been shown. An interval of the end signal TM EXIT is controlled variously according to embodiments.

The signal generator 24 receives the enable signal TM_EN and generates a signal A delayed through the delay unit 240 and generates a signal B inverted through the inverter IV26, and performs a logical multiplication operation of the signal A and the signal B through the AND gate AND22 to generate a pulse signal having a pulse width determined by a delay interval (d) of the delay unit 240, and having a same period as the enable signal TM_EN. The AND gate AND23 is outputted by performing a logical multiplication operation of an output signal of the AND gate AND22 and the end signal TM EXIT, and thus a pulse signal TM_P outputted from the AND gate AND23 becomes a signal having a pulse width determined by a delay interval (d) of the delay unit 240, and having a same period as the enable signal TM_EN, and transited to low level in response to the end signal TM EXIT and the test mode signal TM. In other words, the pulse signal TM_P is generated as a pulse signal during a interval of the test mode signal TM has been enabled to high level and the end signal TM EXIT has been disabled to low level. Therefore, the pulse signal TM_P is generated as a signal having a pulse width determined by a delay interval (d) of the delay unit 240, and having six pulses.

Then, the thermal code output unit 3 is synchronized with the pulse signal TM_P that has been previously generated to output first through sixth thermal codes T<0:5>. In other words, the first through sixth thermal codes T<0:5> are sequentially outputted to a first pad 5 whenever a pulse of the pulse signal TM_P is received.

Then, the strobing signal output unit 4 outputs the pulse signal TM_P through a transmission gate T41, which is turned on in response to a high level of the test mode signal TM, to a second pad 6.

Summarizing above, a thermal code output circuit according to the present disclosure receives a test mode signal TM, which has been enabled to high level, and generates a pulse signal TM_P having six pulses corresponding to the number of first through sixth thermal codes T<0:5>, and the first through sixth thermal codes T<0:5> are synchronized with the pulse signal TM_P and outputted to a first pad 5, and at the same time the pulse signal TM_P is outputted to a second pad 6. In this way, a thermal code output circuit according to the present disclosure can output the first through sixth thermal codes T<0:5> even if a test mode signal TM is once applied. Moreover, after a test mode signal TM is applied, the tester can confirm signals outputted to the first pad 5 and the second pad 6 to correctly judge that a thermal code outputted through the first pad 5 corresponds to which one of the first through sixth thermal codes T<0:5>

It is possible that another embodiment of a thermal code output circuit is embodied by used another embodiment of the end signal generator.

Figure 6:
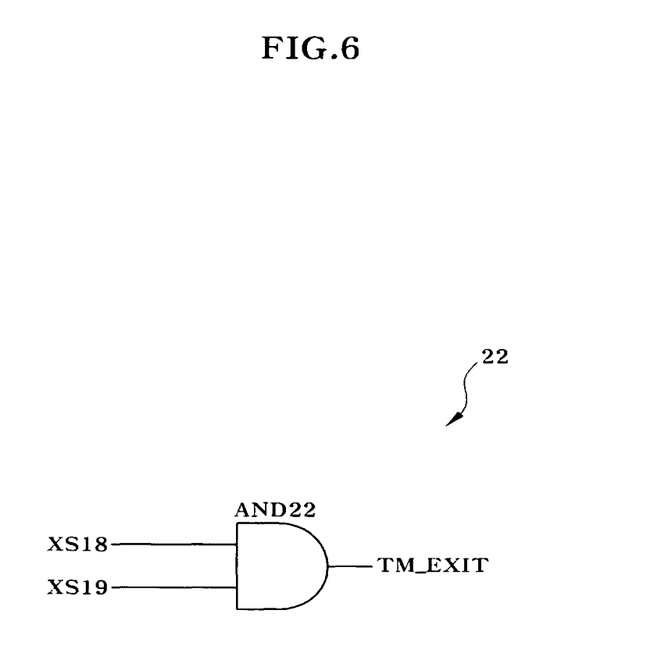
FIG. 6 is a circuit diagram illustrating another embodiment of a end signal generator included in the pulse signal generator of FIG. 3.
Figure 7:
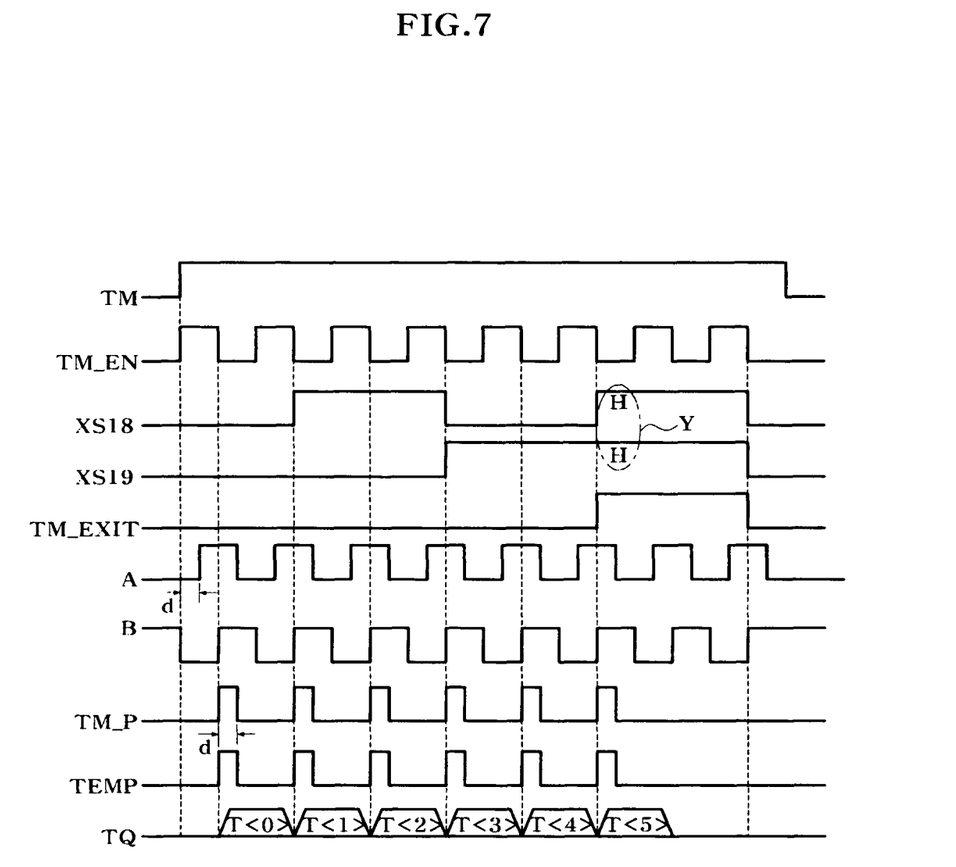
FIG. 7 is a timing diagram explaining an operation of the thermal code output circuit used the end signal generator of FIG. 6.

With reference to FIG. 6, another embodiment of the end signal generator receives the eighth and nineteenth period signals XS18-XS19 and generates an end signal TM EXIT, which is enabled to a high level, when a combination of the eighth and nineteenth period signals XS18-XS19 is 'high level and high level' as shown in a portion "Y" of FIG. 7. The enabled interval of the end signal TM EXIT corresponds to a sixth period interval of the enable signal TM_EN after the test mode signal TM is enabled. In other words, the end signal XM_EXIT is enabled to a high level for a predetermined interval after six pulses of the enable signal TM_EN have been shown. The enabled interval of the end signal TM EXIT generated from the end signal generator of FIG. 6 is 4 times more broad than an enabled interval of the end signal TM EXIT generated from the end signal generator of FIG. 4. Therefore, tester can set up the test mode signal TM having an enabled interval which is more broad than an enabled interval of the test mode signal TM used in the end signal generator of FIG. 3.

Figure 8:
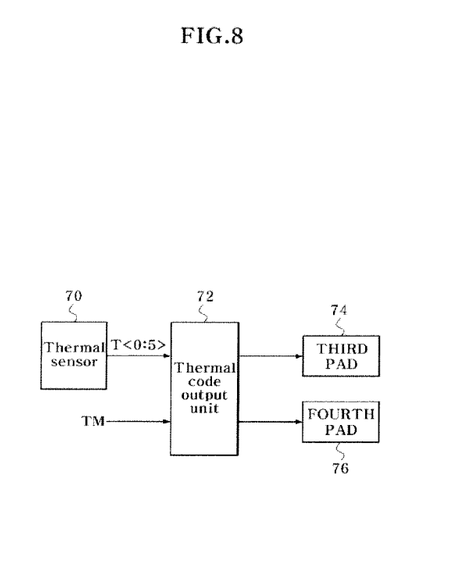
FIG. 8 is a block diagram illustrating a structure of a semiconductor memory device including the thermal code output circuit of FIG. 1.

With reference to FIG. 8, it is possible to confirm a structure of a semiconductor memory device including a thermal code output circuit as described above. As illustrated above, a semiconductor memory device according to this embodiment includes a temperature sensor 70 which generates first through sixth thermal codes T<0:5>, and a thermal code output unit 72 which receives a test mode signal TM and generates a pulse signal TM_P to output to a fourth pad 76, and sequentially outputs the first through sixth thermal codes T<0:5> to a third pad 74 in response to the pulse signal TM_P.

This disclosure claims priority to Korean application number 10-2008-0039585, filed on Apr. 28, 2008, the entire contents of which are incorporated herein by reference.

What is claimed is:

1. A thermal code output circuit, comprising:
   a pulse signal generator configured to generate an enable signal and an end signal in response to a test mode signal and multiple period signals and generate a pulse signal in response to the enable signal when the end signal is disabled;
   a thermal code output unit configured to receive multiple thermal codes from a thermal sensor, and output the multiple thermal codes in synchronization with the pulse signal; and
   a strobing signal output unit configured to output the pulse signal or a reference voltage selectively as a strobing signal in response to the test mode signal.

2. The thermal code output circuit of claim 1, further comprising a period signal generator configured to increase a period of a period signal inputted through a counting operation and generate the multiple period signals.

3. The thermal code output circuit of claim 1, wherein the pulse signal generator includes:
   an enable generator configured to receive a first period signal and the test mode signal and generate the enable signal;
   an end signal generator configured to receive the first period signal and second through fourth period signals and generate the end signal; and
   a signal generator configured to receive the enable signal and the end signal and generate the pulse signal.

4. The thermal code output circuit of claim 3, wherein the enable signal is generated as a period signal having a same period as the first period signal during the test mode signal is enabled.

5. The thermal code output circuit of claim 3, wherein the end signal generator generates the end signal in which an enable interval is adjusted according to a combination of the first through fourth period signals.

6. The thermal code output circuit of claim 3, wherein the signal generator generates the pulse signal having a predetermined pulse width from an interval that the enable signal is enabled to an interval that the end signal is enabled, and the pulse signal is generated with a same period as the first period signal.

7. The thermal code output circuit of claim 3, wherein the signal generator includes:
   a delay unit configured to delay the enable signal for a predetermined interval;
   an inverter configured to invert the enable signal;

a first logic element configured to receive an output signal of the delay unit and an output signal of the inverter and perform a logic operation; and a second logic element configured to receive an inverting signal of the end signal and an output signal of the first logic element and perform a logic operation.

8. The thermal code output circuit of claim 1, wherein the thermal code output unit sequentially outputs multiple thermal codes through a pad in response to the pulse signal.

9. The thermal code output circuit of claim 1, wherein the strobing signal output unit includes:

a first transmission gate configured to transmit the reference voltage to a pad in response to the test mode signal; and a second transmission gate configured to transmit the pulse signal to the pad in response to the test mode signal.

10. The thermal code output circuit of claim 1, wherein the reference voltage has a level corresponding to the internal temperature of a semiconductor memory device.

11. The thermal code output circuit of claim 1, wherein the multiple thermal codes are outputted in synchronization with the strobing signal.

12. A semiconductor memory device, comprising:

a thermal sensor configured to generate a thermal code;

a thermal code output unit configured to generate an enable signal and an end signal in response to a test mode signal and multiple period signals, generate a pulse signal in response to the enable signal when the end signal is disabled, receive multiple thermal codes from a thermal sensor, and output the multiple thermal codes in synchronization with the pulse signal;

a first pad configured to output the thermal code; and a second pad configured to output the pulse signal as a strobing signal.

13. A semiconductor memory device of claim 12, wherein the thermal code output unit includes:

a pulse signal generator configured to generate the enable signal and the end signal in response to the test mode signal and the multiple period signals, and generate the pulse signal in response to the enable signal when the end signal is disabled;

a thermal code output unit configured to output multiple thermal codes in response to the pulse signal; and a strobing signal output unit configured to output the pulse signal or a reference voltage selectively as a strobing signal in response to the test mode signal.

14. The semiconductor memory device of claim 13, wherein the thermal code output unit further comprises a period signal generator configured to increase a period of a period signal inputted through a counting operation and generate the multiple period signals.

15. The semiconductor memory device of claim 13, wherein the pulse signal generator includes:

an enable generator configured to receive a first period signal and the test mode signal and generate the enable signal;

an end signal generator configured to receive the first period signal and second through fourth period signals and generate the end signal; and a signal generator configured to receive the enable signal and the end signal and generate the pulse signal.

16. The semiconductor memory device of claim 15, wherein the enable signal has a same period as the first period signal during the test mode signal is enabled.

17. The semiconductor memory device of claim 16, wherein the end signal generator generates the end signal in which an enable interval is adjusted according to a combination of the first through fourth period signals.

18. The semiconductor memory device of claim 15, wherein the signal generator generates the pulse signal having a predetermined pulse width from an interval that the enable signal is enabled to an interval that the end signal is enabled, and the pulse signal is generated with a same period as the first period signal.

19. The semiconductor memory device of claim 15, wherein the signal generator includes:

a delay unit configured to delay the enable signal for a predetermined interval;

an inverter configured to invert the enable signal;

a first logic element configured to receive an output signal of the delay unit and an output signal of the inverter and perform a logic operation; and a second logic element configured to receive an inverting signal of the end signal and an output signal of the first logic element and perform a logic operation.

20. The semiconductor memory device of claim 13, wherein the thermal code output unit sequentially outputs multiple thermal codes through the first pad in response to the pulse signal.

21. The semiconductor memory device of claim 13, wherein the strobing signal output unit includes:

a first transmission gate configured to transmit the reference voltage to the second pad in response to the test mode signal; and a second transmission gate configured to transmit the pulse signal to the second pad in response to the test mode signal.

22. The semiconductor memory device of claim 13, wherein the reference voltage has a level corresponding to the internal temperature of a semiconductor memory device.

23. The semiconductor memory device of claim 13, wherein the multiple thermal codes are outputted in synchronization with the strobing signal.

* * * * *